United States Patent [19]

McHugh

[11] Patent Number: 5,489,218
[45] Date of Patent: Feb. 6, 1996

[54] ZIF PGA SOCKET AND CONTACT THEREIN

[75] Inventor: Robert G. McHugh, Sunnyvale, Colo.

[73] Assignee: HON HAI Precision Industry Co., Ltd., Taiwan

[21] Appl. No.: 217,606

[22] Filed: Mar. 24, 1994

[51] Int. Cl.⁶ ........................................................ H01R 4/50
[52] U.S. Cl. ............................................. 439/342; 439/259
[58] Field of Search ...................................... 439/259, 261, 439/263, 264, 265, 266, 330, 331, 342

[56] References Cited

U.S. PATENT DOCUMENTS

| | | | |
|---|---|---|---|
| 4,988,310 | 1/1991 | Bright et al. | 439/342 |
| 5,057,031 | 10/1991 | Sinclair | 439/342 X |
| 5,059,135 | 10/1991 | Matsuoka et al. | 439/264 X |
| 5,167,515 | 12/1992 | Matsuoka et al. | 439/342 X |
| 5,342,214 | 8/1994 | Hsu | 439/259 X |

*Primary Examiner*—Khiem Nguyen

[57] ABSTRACT

A ZIF PGA socket (1) includes a base (10) and a lid (40) attached thereon. A cammed actuator (70) includes a handle (72) and a cam section (74) to move the lid (40) with regard to the base (10) in a front-to-end direction. A plurality of cavities (12) vertically extend through the base (10) for reception of the corresponding contacts (80) therein. A plurality of holes (44) extend through the lid in alignment with the corresponding cavities (12), respectively, for insertion and reception of the PGA leads (100). Each contact (80) is made of a metal plate and includes a main body (82). From the main body (82), a post (84) vertically extends downward, and a resilient beam (86) upward extends and inwardly leans to the center of the cavity (12). An engagement portion (90) is upright positioned at the top of the resilient beam (86). A curved leading surface portion (93) extends outward from one end of the engagement portion (90), which incorporates another sloping surface (125) on the fourth sidewall (124) for guiding the inserted PGA lead to move in the back-to-front direction. A recess (130) is disposed in the first sidewall (121) adjacent the top opening of the cavity (12).

6 Claims, 9 Drawing Sheets

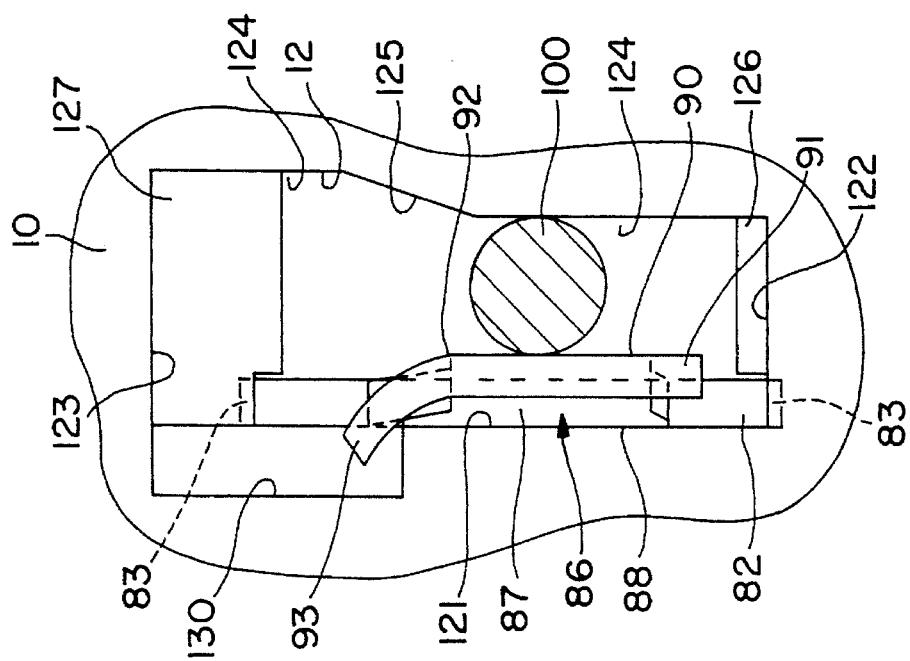
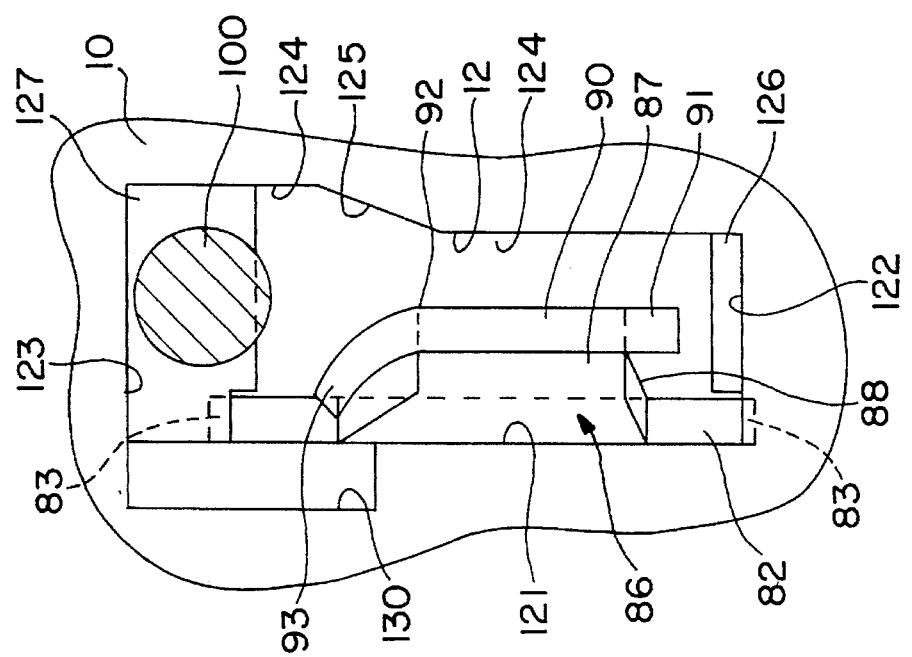

ZIF PGA SOCKET AND CONTACT THEREIN

FIELD OF THE INVENTION

1. Field of the Invention

The invention generally relates to sockets for electrical components, and particularly to sockets for electronic package having therein contacts arranged in a grid array wherein such socket require that zero force be applied to the contacts therein during insertion and removal of the electronic package into and from the socket.

2. The Prior Art

A socket is generally mounted on a board for reception of an electronic component therein so that such component can be ultimately electrically communicated with the circuit traces on the board and to become a part thereof. Zero insertion force (ZIF) is desired during insertion and removal of the electronic package, such as a pin grid array (PGA), into and from the socket.

As shown in many previous U.S. patents, the ZIF PGA socket can be divided to two categories from a viewpoint of contacts used therein. One is to use double beams structure of the contact to sandwich therein a lead projecting downward from the PGA component for electrical and mechanical engagement between the contact of the socket and the lead of the PGA component, for example, U.S. Pat. Nos. 3,676,832, 3,763,459, 4,331,371, 4,381,130, 4,397,512, 4,468,072, 4,498,725, 4,648,669, 4,836,798, 4,889,499, 5,002,499, 5,017,152, 5,037,321, 5,057,031, 5,059,135, 5,092,789, 5,123,855, 5,147,213, 5,167,515, 5,186,642, 5,213,530, 5,213,531 and 5,256,080. The other is to use a single beam structure of the contact incorporating a side wall around a cavity in which such contact is inserted, to sandwich a corresponding lead of PGA component therebetween for electrical and mechanical engagement between the contact of the socket and the lead of the PGA component, for example, U.S. Pat. Nos. 3,315,212, 4,501,461, 4,674,811, 4,887,974, 4,988,310, 5,013,256 and 5,052,101. It can be understood that the single beam contact may take less space than the double beam contact so that the density of the contact within the socket can be increased, and that will meet the requirements of high speed and high frequency of signal transmission in the recent computer industry. On the other hand, the less space of a smaller cavity used in a high density single beam contact socket may restrict the contact design which looks for a good resilience thereof for providing sufficient normal force to mechanically efficiently engage the PGA lead which is inserted into the cavity in the socket. By the way, from a viewpoint of electricity, the single beam contact may increase electric resistance in comparison with the double beams contact because of the reduction of contact area so that the reinforced normal force of the engagement between the contact beam and the PGA lead is further desired for compensating for the loss of electric conduction. While to provide the greater normal force is preferred in the single beam contact design, such contact should not be too stiff to hinder the inserted PGA lead from easily moving during leading the lead to such contact.

An object of the invention is to provide a ZIF PGA socket of which the single beam contact not only has a great resilience and a proper leading surface portion for allowing a minimum resistance during loading the corresponding PGA lead to the contact, but also incorporates the cavity, in which the contact is received, to provide a reinforced normal force and a sufficient contact area thereof for efficiently mechanically and electrically engagement with such corresponding PGA lead.

SUMMARY OF THE INVENTION

According to an aspect of the invention, a ZIF PGA socket includes a base and a lid attached thereon. A cammed actuator includes a handle and a cam section to move the lid with regard to the base in a front-to-end direction. A plurality of cavities vertically extend through the base for reception of the corresponding contacts therein. A plurality of holes extend through the lid in alignment with the corresponding cavities, respectively, for insertion and reception of the PGA leads.

Each contact is made of a metal plate and includes a main body which abut against a cavity first sidewall and retained in position through the side barbs piercing into the base. From the main body, a post vertically extends downward, and a resilient beam upward extends and inwardly leans to the center of the cavity so that the whole resilient beam is all and gradually spaced from the first sidewall which the main body abuts against. An engagement portion is upright positioned at the top of the resilient beam. A curved leading surface portion extends outward from one end of the engagement portion, which incorporates a sloping surface on the fourth sidewall for guiding the inserted PGA lead to move in the back-to-front direction. A recess is disposed in the first sidewall adjacent the opening of the cavity so that the outward curved leading surface portion of the engagement portion can be received within the recess when the whole resilient beam is outward deflected to the first sidewall by the movement of the inserted PGA lead from the un-mated position to the mated position.

BRIEFLY DESCRIPTION OF THE DRAWINGS

FIG. 8(A) is a fragmentary top view of the base of the socket assembly of FIG. 1 with the PGA lead inserted therein in the un-mated condition.

FIG. 8(B) is a fragmentary top view of the base of the socket assembly of FIG. 1 with the PGA lead inserted therein in the mated condition.

DESCRIPTION OF THE INVENTION

References will now be made in detail to the preferred embodiments of the invention. While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by appended claims.

Figure 1:
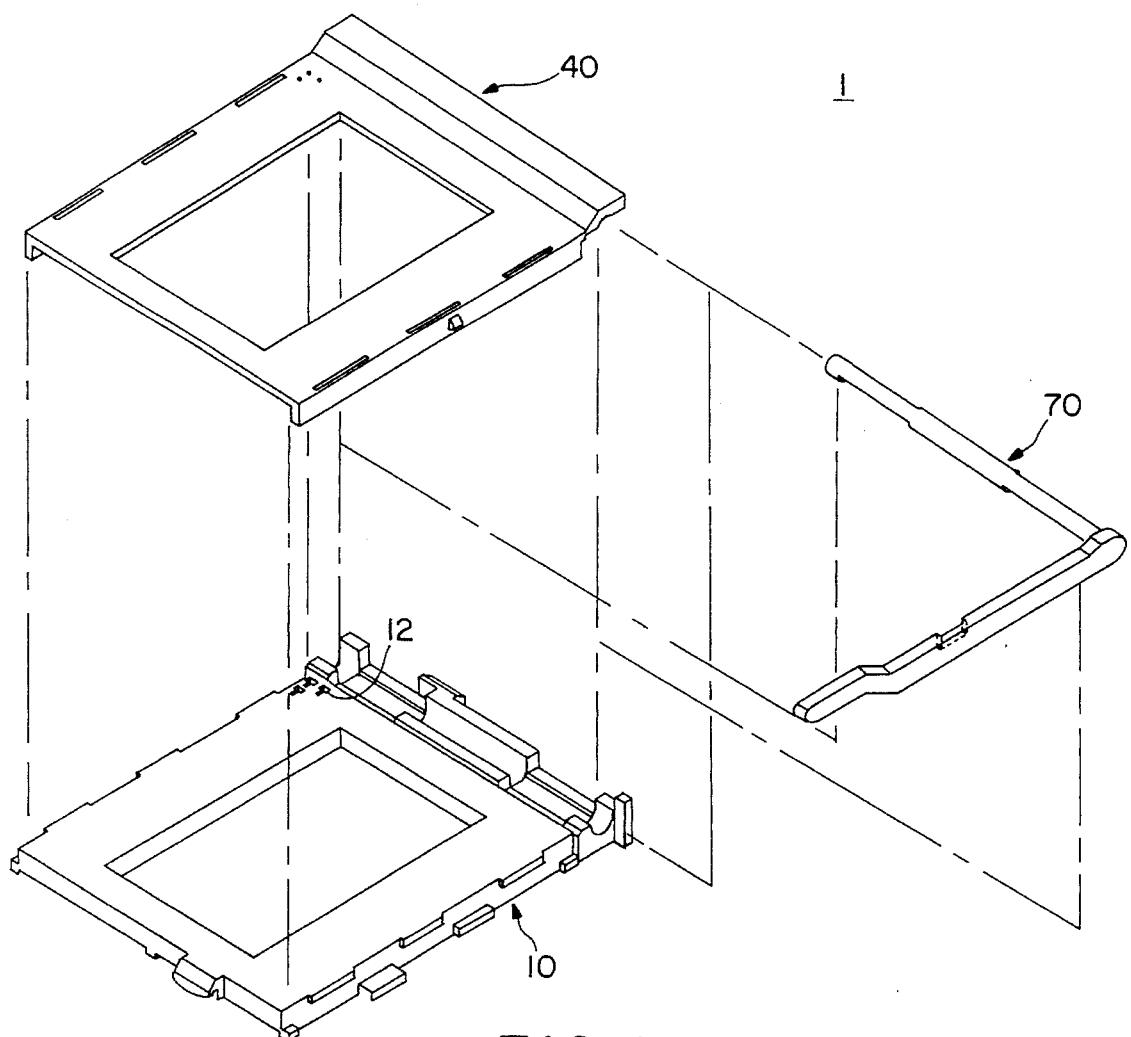
FIG. 1 is an exploded perspective view of the presently preferred embodiment of a ZIF PGA socket assembly without contacts within according to this invention wherein instead of the actual grid array arrangement, only three cavities in the base and three holes in the lid are shown thereof for illustration.

It will be noted here that for a better understanding, like components are designated by like reference numerals throughout the various figures in the embodiment. Attention is now directed to FIG. 1 wherein a ZIF PGA socket assembly 1 includes a base 10, a lid 40 slidably attached thereon which is moved by a cammed actuator 70.

Figure 2:
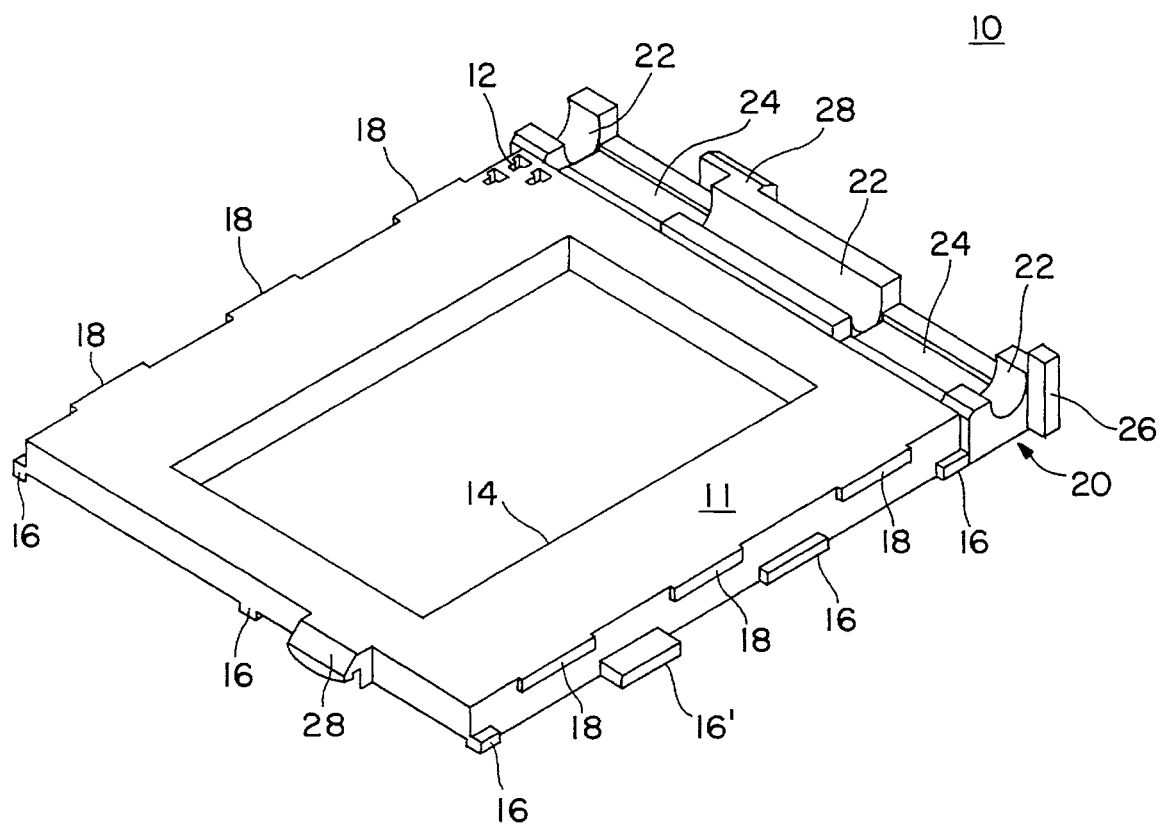
FIG. 2 is a perspective view of the base of the socket assembly of FIG. 1.
Figure 5:
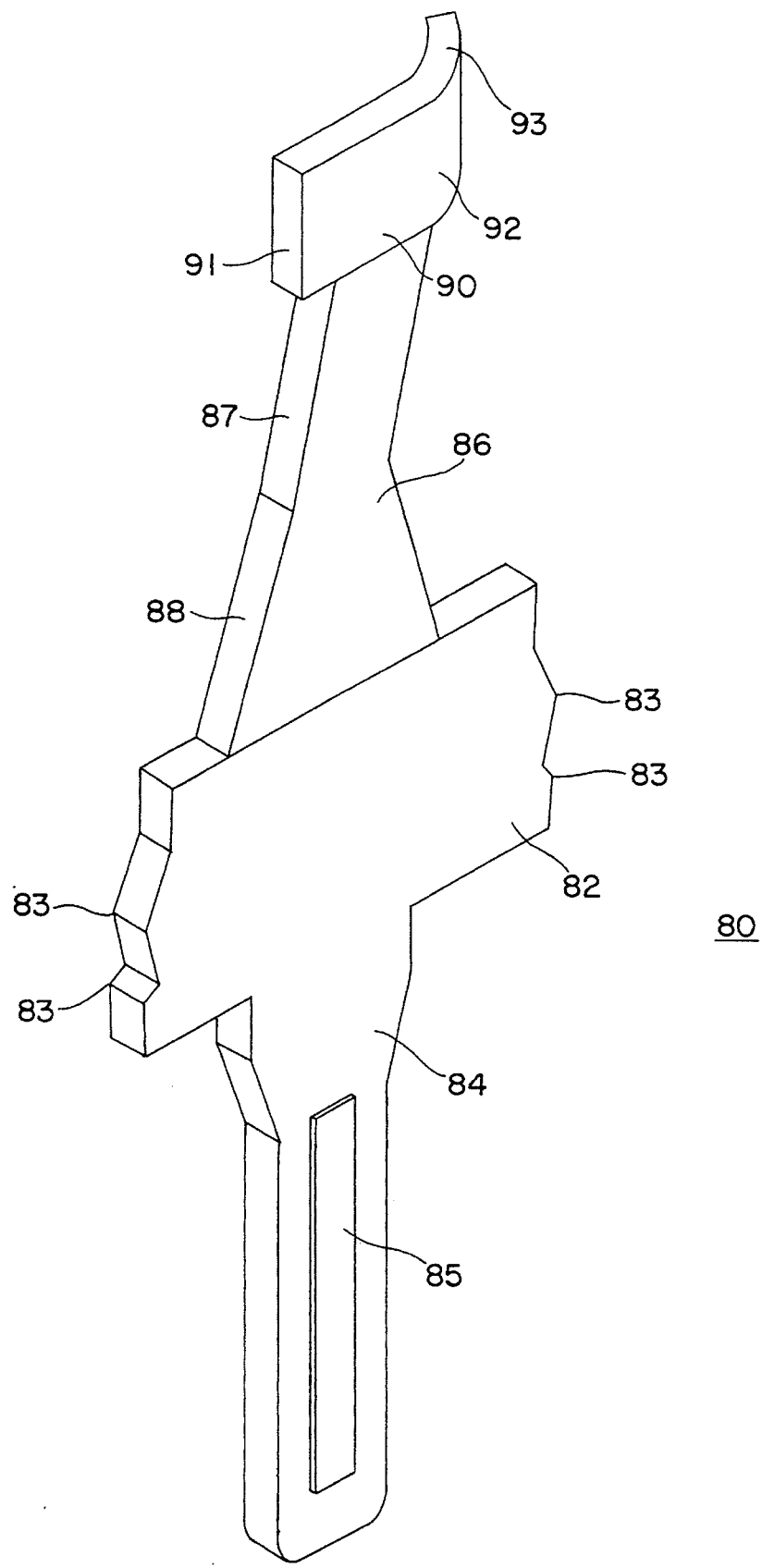
FIG. 5 is an enlarged perspective view of the contact of the socket assembly of FIG. 1.

Also referring to FIG. 2, the base 10 comprises a generally rectangular member 11 made form a dielectric plastic material and having an optional rectangular opening 14 in the center portion. A plurality of spaced apart cavities 12 extend vertically through the base 10 for receiving the corresponding contacts 80 as shown in FIG. 5, respectively. A plurality of spaced stand-offs 16 extend downward along the periphery of the base approximate the bottom surface for mounting the base on a PC board (not shown), wherein one stand-off 16' has an expanded lateral dimension for having the actuator 70 seated thereon.

A plurality of spaced apart engaging bars 18 are disposed approximate the top edges of two sides of the base 10. A cam journal section 20 integrally provided on the rear side of the base 10, includes three spaced apart bearing portions 22 and two operation portions 24 each intermediating between two spaced bearing portions 22. A stopper 26 is provided at one end of the cam journal section 20 to prevent the actuator 70 from over-rotation. A pair of holding means 28 are disposed on the front side and the rear side, respectively.

Figure 3:
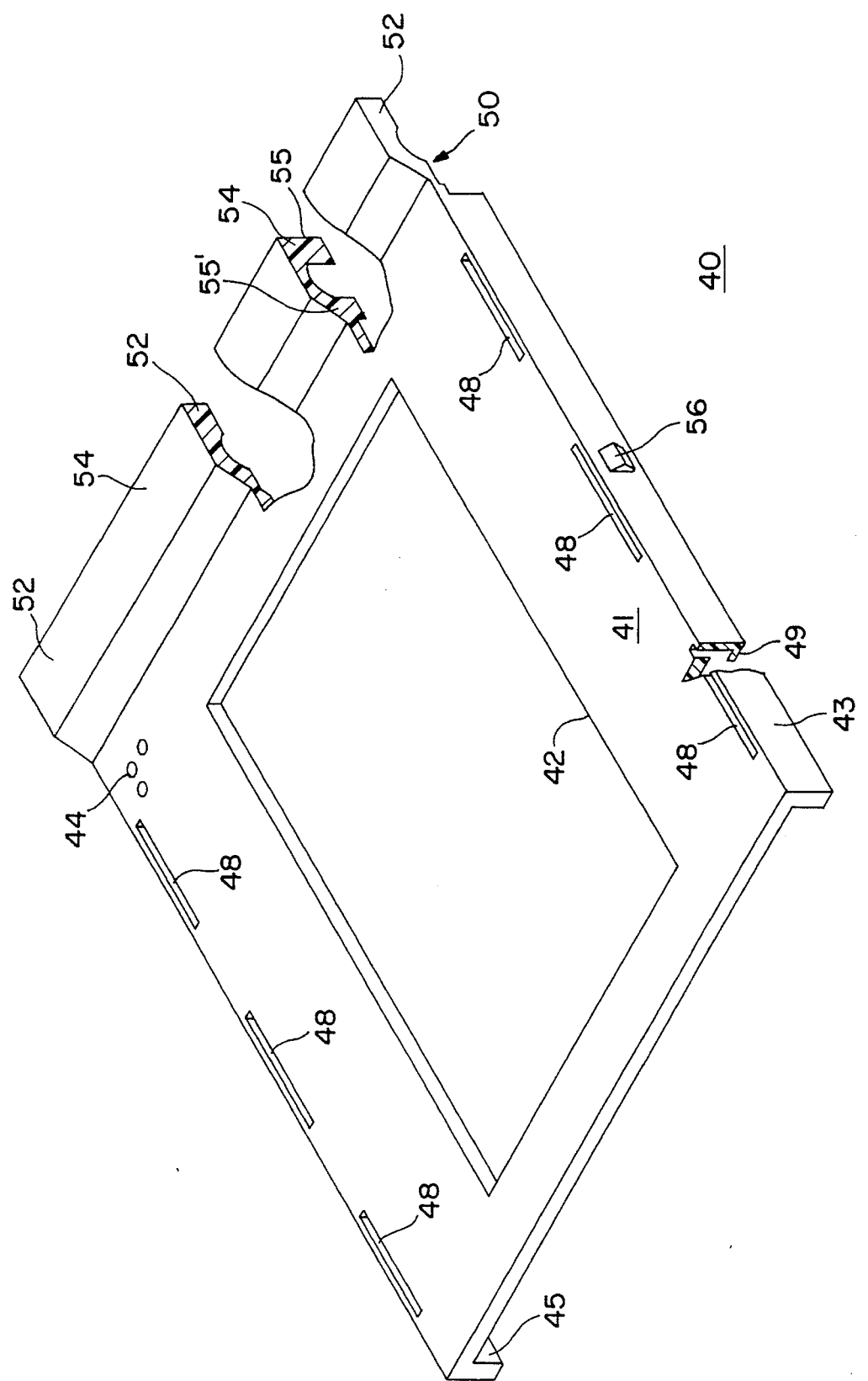
FIG. 3 is a perspective view of the lid of the socket assembly of FIG. 1 with portions thereof cut-away to show the detent structure and the shroud structure on the underside and the backside.

Also with reference to FIG. 3, similar to the base 10, the lid 40 comprises a generally rectangular member 41 made from a dielectric plastic material, and having an optional opening 42 in the center portion. A plurality of holes 44 vertically extend through the lid 40 in alignment with corresponding cavities 12 of the base 10, respectively. Therefore, a PGA lead can extend through the hole 44 in the lid 40 and into corresponding the cavity 12 of the base 10. Two sidewalls 43, 45 extend downward from two opposite sides of the member 41. By means of the spaced openings 48 provided in the member 41, a corresponding number of spaced hooks 49 are provided along the lower edges of the side walls 43, 45 and in vertical alignment with the corresponding openings 48, respectively. The lid 40 can be attached onto the base 10 by means of the engagement of the engagement bars 18 of the base 10 with the corresponding hooks 49 of the lid 40.

A shroud section 50 integrally provided on the rear side of the lid 40, includes three spaced apart bearing portions 52 respectively in vertical alignment with the bearing portions 22 of the cam journal section 20 of the base 10, and two spaced operation portions 54 respectively in vertical alignment with the operation portions 24 of the cam journal section 20 of the base 10. A protrusion 56 is disposed on the outer surface of the right sidewall 43 for retaining the actuator 70 in a horizontal position.

Figure 4:
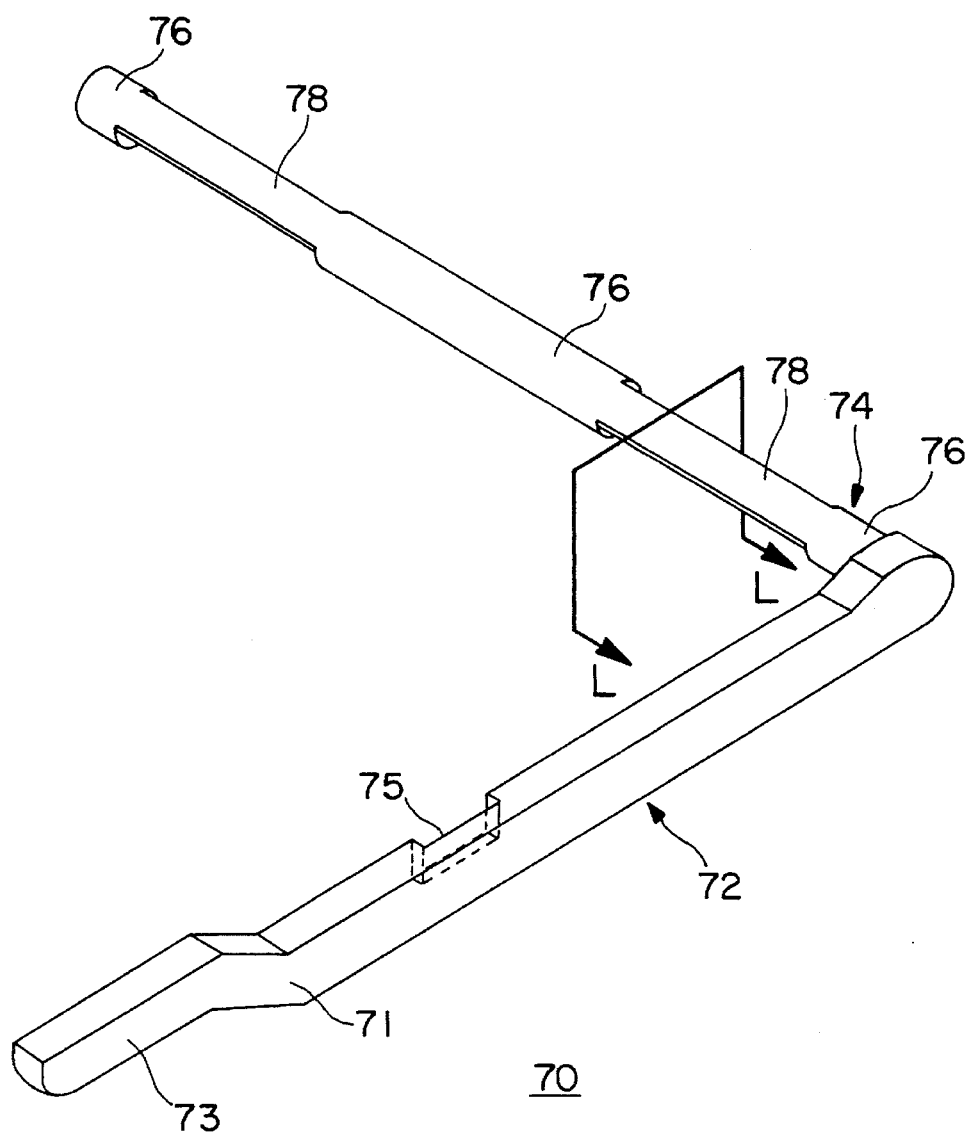
FIG. 4 is a perspective view of the actuator of the socket assembly of FIG. 1.
Figure 4A:
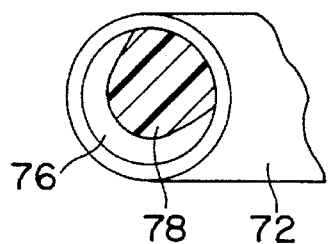
FIG. 4(A) is a fragmentary cross-sectional view, along line L—L, of the actuator of the socket assembly of FIG. 4.

Also with reference to FIG. 4 and FIG. 4(A), the L-shaped actuator 70 includes integrally a handle 72 positioned beside the right sidewall of the base 10, and a cam section 74 protectingly sandwiched between the cam journal section 20 of the base 10 and the shroud section 50 of the lid 40. The cam section 74 includes three spaced pivotal generally round shafts or stabilizers 76 fittingly rotatably seated within the corresponding bearing portions 22 of the cam journal section 20 of the base 10, respectively, and two spaced cam surfaces 78 each intermediating between two adjacent shafts 76 and actuating the operation portions 54 of the shroud section 50 of the lid 40 to move back and forth. The handle 72 includes an angled elbow 71 from which an offset portion 73 depends. The offset portion 73 is parallel to the handle 72 and allows for convenient manipulation of the cammed actuator 70. A detent 75 is provided in the inner side of the handle 72 to cooperate with the protrusion 56 of the lid 40 for retention of the actuator 70 in position.

When assembled, the lid 40 is loaded onto the base 10 with the cam section 74 being sandwiched between the shroud section 50 of the lid 40 and the cam journal section 20 of the base 10. By downward pressing, the lower edges of the left sidewall 45 and the right sidewall 43 of the lid 40 can be deflected outward to have the hooks 49 pass the corresponding engaging bars 18 until such lower edges of the side walls are seated on the stand-offs 16 of the base 10. At this moment, the side walls 43, 45 of the lid 40 get back to normal vertical condition, and the hooks 49 of the lid 40 engage the engaging bars 18 of the base 10 thus preventing the lid 40 from moving with regard to the base 10 upward. Additionally, the two opposite vertical walls 55, 55' of the operation portions 54 of the shroud section 50 of the lid 40 engage, from two sides, the corresponding cam surfaces 78 of the cam section 74 of the actuator 70, thus limiting the movement of the lid 50 in the front-to-end direction because the cam section 74 of the actuator 70 can only rotate within the bearing portions 22 of the cam journal section 20 without optional movement in the front-to-end direction. Under this situation, the round shafts 76, which are respectively seated in the bearing portions 22, laterally engage the raised operation portions 24 beside, thus preventing the cam section 74 of the actuator 70 from moving in a left-to-right direction. Because such actuator 70 is sandwiched between the shroud section 50 of the lid 40 and the cam journal section 20 of the base 10, and can not move in the lateral direction, it will be in position without removal. Therefore, the whole assembly including the base 10, the lid 40 and the actuator 70 can be permanently assembled without any risk of dissembling.

Also referring to FIG. 5, the contact 80 is positioned within the cavity 12 of the base 10. Each contact 80 is generally in form of plate, and includes an upright main body 82 from which barbs 83 extend outwardly and laterally. A post 84 vertically extends downward from the bottom of the main body 82 for reception within a hole of the PC board (not shown) on which the socket 1 is mounted. A protruding rib 85 extends lengthwise of the post 84 for reinforcement. A resilient beam 86, which upward and slantingly extends from the top of the main body 82, comprises a generally strap-like upper half portion 87 and a generally trapezoid-like lower half portion 88. An engagement portion 90 is upright positioned at the top of the resilient beam 86 so that such engagement portion 90 is generally parallel to the main body 82. Two opposite ends 91, 92 of the engagement portion 90 extend out of the dimension of the width of the upper half portion 87 of the resilient beam 86 for mechanical consideration. From the end 92 of the engagement portion 90, a curved leading surface portion 93 integrally extends in the direction opposite to the inclination of the resilient beam 86.

Figure 6:
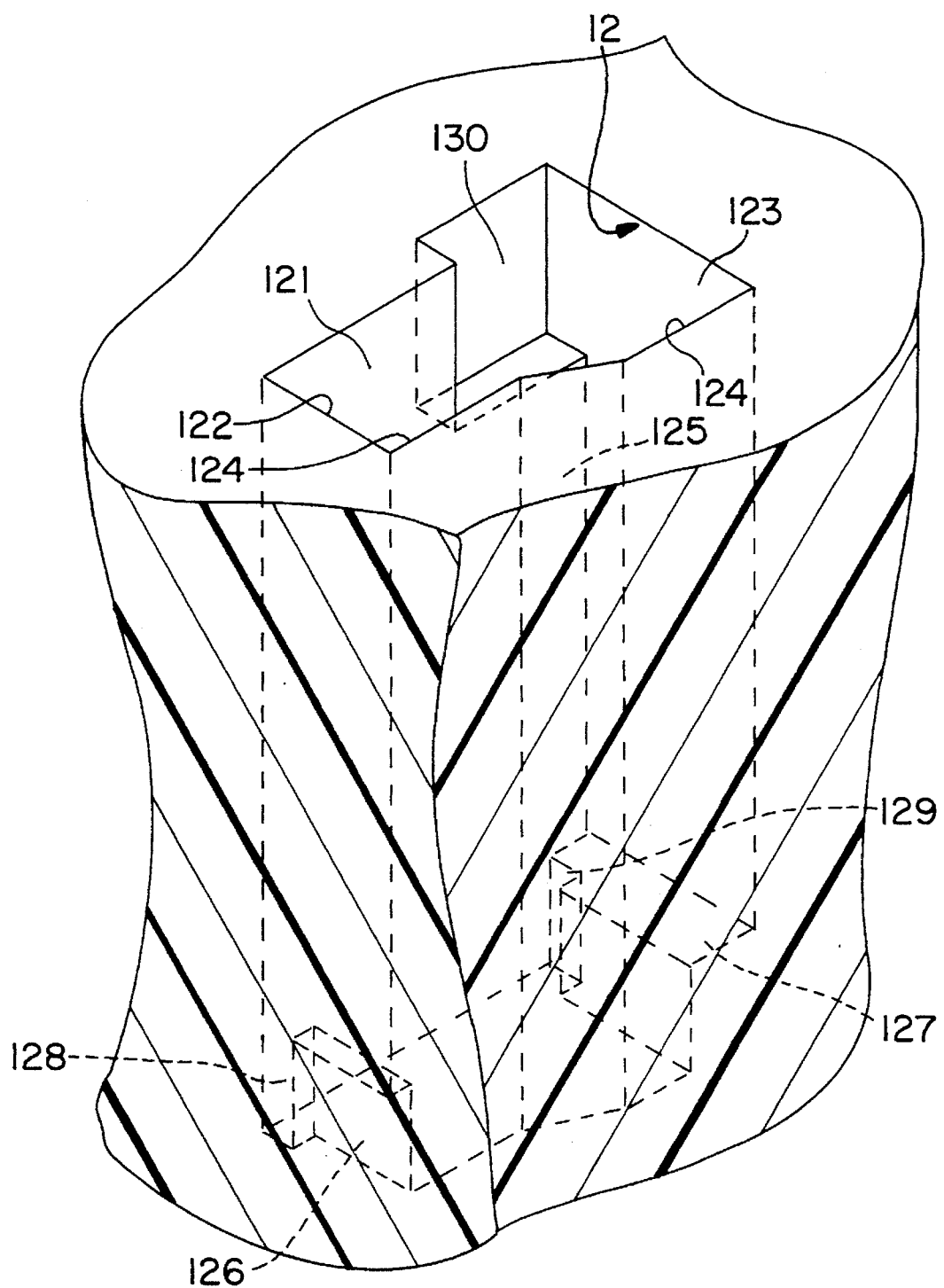
FIG. 6 is an enlarged perspective view of a portion of the base of the socket assembly of FIG. 1 to show the cavity therein.

Referring to FIG. 6, each cavity 12 in the base 10 extends therethrough, and comprises two opposite first sidewall 121 and fourth sidewall 124, and another two opposite second sidewall 122 and third sidewall 123 wherein the fourth sidewall 124 includes a sloping surface 125 thereof so that the cavity 12 is generally of a shape having a large dimension in the rear and a small dimension in the front. Two blocks 126 and 127 respectively protrude out of the lower portions of the corresponding second sidewall 122 and third sidewall 123 and into the cavity 12, and incorporate the first sidewall 121 to form a pair of opposite retention slots 128, 129 for retaining the main body 82 of the contact 80 therein. Adjacent the top opening of the cavity 12, a recess 130 is formed in the first sidewall 121 and communicates with the cavity 12.

Referring to FIGS. 5, 6, 7(A) and 8(A), when the contact 80 is loaded into the cavity 12 in the base 10, two sides of the main body 82 can be retained within the corresponding slots 128 and 129, respectively, through the barbs 83 piercing into the base 10. In other words, the main body 82 of the contact 80 is sandwiched between the blocks 126, 127 and the first sidewall 121 so that the main body 82 abuts against the first sidewall 121. The lower edge of the main body 82 is generally flush with the bottom surface of the base 10, so the post 84 downward extends out of the cavity 12. In contrast, the resilient beam 86, which has a substantially sufficient length, leans from the first sidewall 121 to the center of the cavity 12 and further toward the fourth sidewall 124. The whole resilient beam 86 is gradually, from the bottom to the top, spaced away from the first sidewall 121, and has a maximum distance spaced form the first sidewall 121 at the top. The engagement portion 90 is upright positioned in the cavity 12 without any portion thereof contacting any sidewalls of the cavity 12. The top of the engagement portion 90 is almost flush with the top opening of the cavity 12.

Figure 7A:
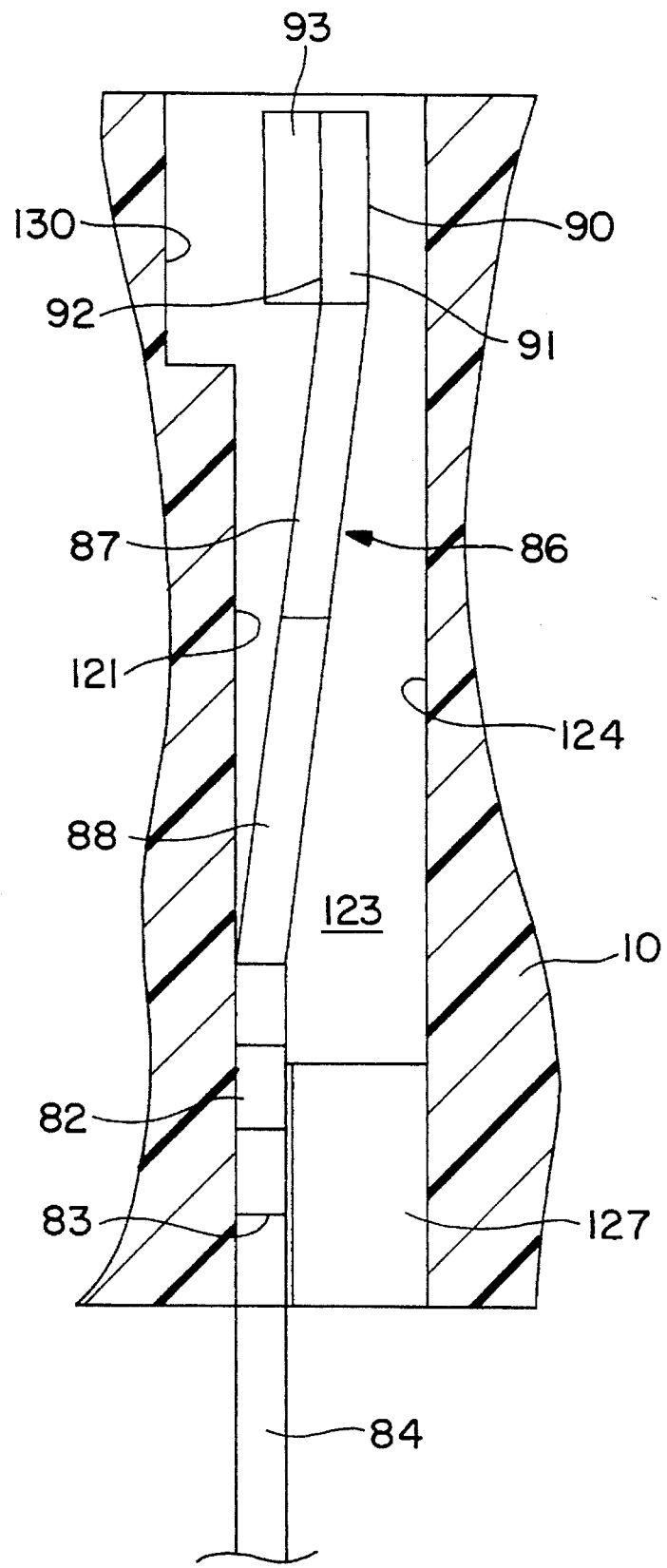
FIG. 7(A) is a fragmentary cross-sectional view of the base of the socket assembly of FIG. 1 to show the position of the contact in the corresponding cavity in the base of the socket assembly without the PGA lead inserted therein.
Figure 7B:
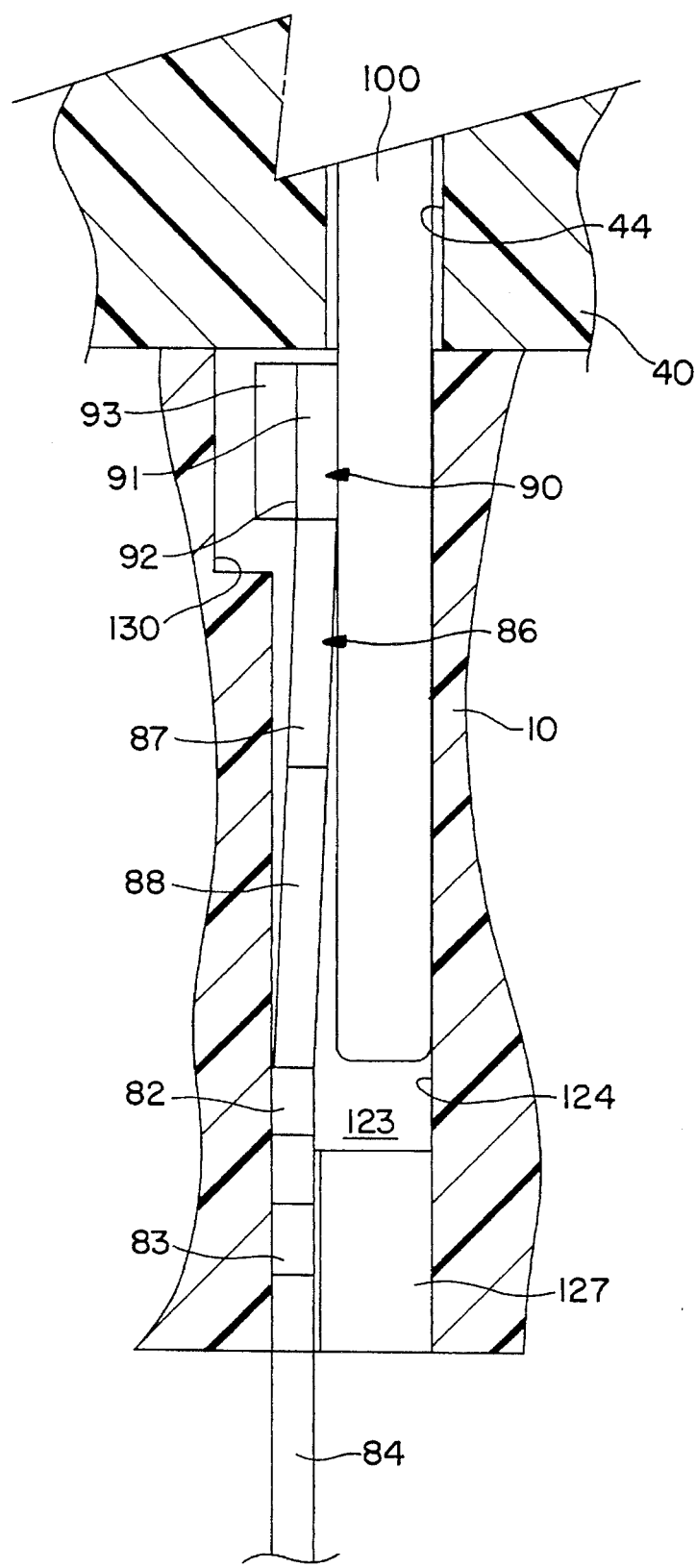
FIG. 7(B) is a fragmentary cross-sectional view of the socket assembly of FIG. 1 to show the position of the contact in the corresponding cavity in the base of the socket assembly with the engaged PGA lead.

Referring to FIGS. 7(B), 8(A) and 8(B), when a PGA component is intended to be loaded onto the socket 1, the handle 72 of the actuator 70 is lifted from the horizontal position to the upright position. The cam section 74 of the actuator 70 is rotated within the cam journal section 20 of the base 10, and the cam surfaces 78 respectively push the corresponding vertical walls 55 of the operation portions 54 backwardly so that the lid 40 is moved backwardly. It is noted that the handle 72 of the actuator 70 can stop rotating further by confronting the stopper 26 of the base 10 so that the lid 40 is properly held in such rear position. Under this situation, the holes 44 of the lid 40 are aligned with the rear portions of the corresponding cavities 12 in the base 10, such that the PGA lead 100 extending through the hole 44 in the lid 40 can be vertically inserted into the rear portion of the cavity 12 as shown in FIG. 8(A), with zero force. The contact 80 and the PGA lead 100 are in an un-mated condition at this stage.

Successively, the handle 72 of the actuator 70 is rotated from the vertical position to get back to the original horizontal position, and the cam surfaces 78 push the vertical walls 55' of the operation portions 54 of the lid 40 forwardly so that the lid 40 is moved forwardly and back to its original position where the holes of the lid 40 are aligned with the front portions of the corresponding cavities 12 in the base 10, respectively. Because the PGA lead is properly surrounded by the corresponding hole 44 of the lid 40, such that PGA lead 100 can be forced to move forward along with the hole 44 and be positioned in the front portion of the cavity 12 in the base 10. The forward movement of the PGA lead 100 is smooth by means of the cooperation of the leading surface portion 93 and the sloping surface 125 on the fourth sidewall 124. During the procedure of this engagement of the PGA lead 100 with the engagement portion 90 of the contact 80, the whole upward extending resilient beam 86 is outwardly deflected toward the first sidewall 121 until such PGA lead 100 is in its final position. Under this situation, the resilient beam 86 is closer to the first sidewall 121 than that in the un-mated condition, and the leading surface portion 93 of the engagement portion 90 can retreat to be positioned in the recess 130 in the first sidewall 121 beside the cavity 12. It can be seen that the PGA lead 100 is substantially sandwiched between the fourth sidewall 124 and the engagement portion 90 of the contact 80 for good mechanical and electrical mated condition. In this embodiment, as shown in FIG. 8(B), the leading surface portion 93 of the contact 90 can slightly touch the first sidewall 121 for providing an enhanced force during the mating condition. Anyhow, it is not necessary to have the leading surface portion 93 or any other portion of the engagement portion 90 of the contact 80 contacts any sidewall when the contact 80 is in a mated condition in other preferred embodiments.

When the PGA component is intended to be unloaded from the socket 1, the handle 72 of the actuator 70 is lifted to the vertical position so the PGA lead 100 can be moved to the rear portion of the cavity 12 as shown in FIG. 8(A) and withdrawn therefrom with zero force.

It can be understood that the whole inwardly inclined resilient beam 86 provides a significant resilience thereof so that an appropriate normal force exerted by the bending moment can retainably press the inserted PGA lead against the fourth sidewall 124. Additionally, the engagement portion 90 is generally aligned at the top of the lengthwise resilient beam 86 so that in comparison with other prior art single beam contact, the engagement portion 90 not only has greater contact area with the PGA lead, but also provides an even structure thereof for not twisting or tilting thereabout itself when the contact 80 is in a mated condition. The recess 130 in the first sidewall 121, which can receive the leading surface 93 therein, allows for greater tolerance or deviation of the structures and the dimensions of the resilient beam 80, the engagement portion 90 and the leading surface 93.

While the present invention has been described with reference to a few specific embodiments, the description is illustrative of the invention and is not to be construed as limiting the invention. Various modifications to the present invention can be made to the preferred embodiment by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A ZIF PGA socket assembly for use with a PGA component, comprises:

a base including a first rectangular member having a plurality of cavities vertically extending therethrough;

a cam journal section integrally provided on a rear side of the base;

a lid slidably attached onto the base, said lid including a second rectangular member having a plurality of holes vertically extending therethrough and in alignment with the corresponding cavities, respectively;

a shroud section integrally provided on a rear side of the lid and on the top of the cam journal section of the base;

an actuator including a handle beside the base and a cam section in the cam journal section for actuating the lid to move in a front-to-end direction; and a plurality of contacts positioned within the corresponding cavities, respectively;

each said contact including an upright main body having means for retain the contact within the cavity, a post downward extending from the bottom of the main body and protruding out of a bottom surface of the base, an elongated resilient beam upward extending and inwardly leaning to a center portion of the cavity, and an engagement portion being upright aligned at the top of the slanting resilient beam, wherein a curved leading surface portion which integrally extends from an end of the engagement portion in a direction opposite to the inclination of the resilient beam, incorporates a recess which is recessed in a sidewall and communicates with the cavity, to allow for smooth movement of an inserted PGA lead back and forth; and wherein each cavity has a first sidewall which the main body of the contact abuts against and said recess is positioned in, and an opposite fourth sidewall on which a sloping surface is provided so that a rear portion of the cavity is larger than a front portion for zero insertion force of said PGA component; each cavity also has a second sidewall in the front portion and an opposite third sidewall in the rear portion on which two opposite blocks are provided at lower portions in the cavity, two retention slots being formed between the first sidewall and said two blocks, respectively, for sandwiching the main body of the contact therebetween.

2. The socket assembly as described in claim 1, wherein the means of the main body for retaining are barbs which pierce into the base.

3. The socket assembly as described in claim 1, wherein the cam journal section of the base has spaced first bearing portions and first operation portions which cooperate with spaced second bearing portions and second operation portions of the shroud section to sandwich the cam section of the actuator therein whereby spaced stabilizers of the cam section of the actuator can be rotatably seated in the first and second bearing portions, and cam surfaces of the cam section of the actuator can push vertical walls of the operation portions of the shroud section of the lid back and forth so that the lid can be moved in the front-to-end direction.

4. The socket assembly as described in claim 3, wherein the stabilizers of the cam section of the actuator are restricted in a lengthwise direction along said cam section by the adjacent raised operation portions of the cam journal section of the base so that said actuator can not detached from said socket assembly from said direction.

5. The socket assembly as described in claim 1, wherein the base has spaced engaging bars incorporating hooks of the lid for fastening the lid to the base.

6. A ZIF PGA socket assembly (1) for use with a PGA component, comprises:

a base (10) including a first rectangular member (11) having a plurality of cavities (12) vertically extending therethrough wherein each of the cavities (12) is generally defined by two opposite first sidewall (121) and fourth sidewall (124), and other two opposite second sidewall (122) and third sidewall (123);

a lid (40) slidably attached onto the base (10), said lid (40) including a second rectangular member (41) having a plurality of holes (44) vertically extending therethrough and in alignment with the corresponding cavities (12), respectively;

an actuator (70) actuating the lid (40) to move in a front-to-end direction; and a plurality of contacts (80) positioned within the corresponding cavities (12), respectively;

each said contact (80) including a main body (82) having means for retain the contact (80) within the cavity (12), a post (84) downward extending from the bottom of the main body (82) and protruding out of a bottom surface of the base (10), an elongated resilient beam (86) upward extending and inwardly leaning to a center portion of the cavity (12), and an engagement portion (90) positioned at the top of the slanting resilient beam (86); wherein a curved leading surface portion (93) integrally extends from an end of the engagement portion (90) toward the first sidewall (121), and a recess (130) is recessed within the first sidewall (121) so that when an inserted pin of PGA component moves from the third sidewall (123) to the second sidewall (122), the resilient beam (86) is deflected toward the first sidewall (121) and the curved leading surface portion (93) of the engagement portion (90) can be received within the recess (130) in the first sidewall (121).

* * * * *